(12) United States Patent
Kuo et al.

(10) Patent No.: US 8,445,335 B2
(45) Date of Patent: May 21, 2013

(54) METHOD OF FORMING PIXEL STRUCTURE

(75) Inventors: Jing-Tin Kuo, Hsin-Chu (TW);
Che-Chia Hsu, Hsin-Chu (TW);
Chao-Liang Lu, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/563,766

(22) Filed: Aug. 1, 2012

(65) Prior Publication Data

US 2012/0301988 A1   Nov. 29, 2012

Related U.S. Application Data

(62) Division of application No. 12/560,437, filed on Sep. 16, 2009, now Pat. No. 8,263,979.

(30) Foreign Application Priority Data

Jun. 11, 2009 (TW) .............................. 98119525 A

(51) Int. Cl.
*H01L 21/335* (2006.01)

(52) U.S. Cl.
USPC ............. 438/149; 438/34; 438/151; 438/164; 257/59; 257/72; 257/E51.005; 257/E21.582

(58) Field of Classification Search
USPC ................ 438/34, 149, 151, 164; 257/59, 72, 257/E51.005, E21.582
See application file for complete search history.

(56) References Cited

U.S. PATENT DOCUMENTS

| 6,486,933 | B1 | 11/2002 | Cha et al. |
| 2007/0176874 | A1 | 8/2007 | Yeh |
| 2008/0111138 | A1 | 5/2008 | Lin |
| 2009/0086117 | A1 | 4/2009 | Chen |
| 2009/0115947 | A1 | 5/2009 | Huang |
| 2010/0079427 | A1 | 4/2010 | Kuo |

FOREIGN PATENT DOCUMENTS

| CN | 101369082 A | 2/2009 |
| TW | 200821721 | 5/2008 |
| TW | 200916925 | 4/2009 |
| TW | 200921217 | 5/2009 |

*Primary Examiner* — Kenneth Parker
*Assistant Examiner* — John Lin
(74) *Attorney, Agent, or Firm* — Winston Hsu; Scott Margo

(57) ABSTRACT

A method of forming a pixel structure is provided. A pixel electrode made of transparent conductive material is formed to electrically connect a data line and a source electrode of a switching element of the adjacent sub-pixel region so that a plurality of sub-pixels can share the same data line. The number of data lines can be reduced, and the aperture ratio (AR) can be improved.

7 Claims, 7 Drawing Sheets

METHOD OF FORMING PIXEL STRUCTURE

CROSS REFERENCE TO RELATED APPLICATIONS

This application is a divisional of application Ser. No. 12/560,437 filed Sep. 16, 2009, now allowed, which is incorporated by reference herein in its entirety.

BACKGROUND OF THE INVENTION

1. Field of the Invention

The present invention relates to a pixel structure and method of making the same, and more particularly, to a pixel structure which includes a plurality of sub-pixels sharing the same data line and method of making the same.

2. Description of the Prior Art

A display panel includes a plurality of pixels arranged in matrix, where each pixel includes a plurality of sub-pixels e.g. a red sub-pixel, a green sub-pixel and a blue sub-pixel for respectively providing light beams of different primary colors such as red light, green light and blue light. For each pixel, the different light beams provided by the different sub-pixels of each pixel have different gray scales based on received data signals. The light beams of different primary colors will mix, so that each of the pixels may display light beams with particular luminance and color. Accordingly, the whole pixels can display desired colorful image.

Since each sub-pixel of each pixel must receive different data signals, the number of the data lines which are used to deliver data signals, will increase as the resolution of the display panel increases. However, since the data lines are made of non-transparent conductive material, the aperture ratio of the display panel is adversely affected when the number of the data lines increases. This low aperture ratio due to excessive data lines becomes a limitation of brightness improvement

SUMMARY OF THE INVENTION

It is therefore one of the objectives of the present invention to provide a pixel structure and method of making the same to reduce the numbers of data lines and to improve aperture ratio.

According to the present invention, a pixel structure is provided. The pixel structure includes a substrate, a first gate line, a second gate line, a first switching element, a second switching element, a first pixel electrode and a second pixel electrode. The substrate includes a first sub-pixel region and a second sub-pixel region. The first gate line is disposed on a side of the first sub-pixel region and the second sub-pixel region. The second gate line is disposed on the other side of the first sub-pixel region and the second sub-pixel region opposite to the first gate line. The first switching element is disposed in the first sub-pixel region, and the first switching element includes a first gate electrode electrically connected to the first gate line, a first source electrode, and a first drain electrode. The second switching element is disposed in the second sub-pixel region, and the second switching element includes a second gate electrode electrically connected to the second gate line, a second source electrode, and a second drain electrode. The first pixel electrode is disposed in the first sub-pixel region and electrically connected to the first drain electrode, wherein the second source electrode is electrically connected to the first drain electrode through the first pixel electrode. The second pixel electrode is disposed in the second sub-pixel region and electrically connected to the second drain electrode.

According to the present invention, a method of forming a pixel structure is also provided. The method includes the following steps. A substrate is provided, and a first sub-pixel region and a second sub-pixel region are defined on the substrate. A first patterned metal layer which includes a first gate line, a second gate line, a first gate electrode, and a second gate electrode is then formed on the substrate. The first gate line is disposed on a side of the first sub-pixel region and the second sub-pixel region. The second gate line is disposed on the other side of the first sub-pixel region and the second sub-pixel region opposite to the first gate line. The first gate electrode is disposed in the first sub-pixel region and electrically connected to the first gate line. The second gate electrode is disposed in the second sub-pixel region and electrically connected to the second gate line. Following that, an insulating layer and a semiconductor layer are formed. Subsequently, a second patterned metal layer which includes a first source electrode, a first drain electrode, a second source electrode and a second drain electrode is formed. The first source electrode and the first drain electrode are disposed in the first sub-pixel region, and the first source electrode, the first drain electrode and the first gate electrode form a first switching element. The second source electrode and the second drain electrode are disposed in the second sub-pixel region, and the second source electrode, the second drain electrode and the second gate electrode form a second switching element. Thereafter, a dielectric layer is formed. Subsequently, a transparent conductive layer is formed on the dielectric layer, and the transparent conductive layer is patterned to from a first pixel electrode and a second pixel electrode. The first pixel electrode is disposed in the first sub-pixel region and electrically connected to the first drain electrode, and the second source electrode is electrically connected to the first drain electrode through the first pixel electrode. The second pixel electrode is disposed in the second sub-pixel region and electrically connected to the second drain electrode.

In the pixel structure of the present invention, the pixel electrode is used as an interface for electrically connecting the data line and the source electrode of the switching element of the adjacent sub-pixel region, such that plural sub-pixels can share the same data line. Consequently, the number of data lines can be reduced, and the aperture ratio of the pixel structure is accordingly advanced.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in details. The preferred embodiments of the present invention are illustrated in the accompanying drawings with numbered elements. In the preferred embodiments, a pixel structure of a liquid crystal display panel is exemplarily illustrated, and the pixel structure may be applied to other suitable types of display panel. Also, certain terms are used throughout the following descriptions and claims to refer to particular components. As one skilled in the art will appreciate, manufacturers may refer to a component by different names. This document does not intend to distinguish between components that differ in name but in function. In the following discussion and in the claims, the terms "include" and "comprise" are used in an open-ended fashion, and thus should be interpreted to mean "including, but not limited to . . . ". In addition, the term "electrically connected" includes any directly or indirectly electrical connection methods. Therefore, if the description in the following paragraphs is that a first device is electrically connected to a second device, the aforementioned words stand for that the first device can be electrically connected to the second device directly or be electrically connected to the second device indirectly by means of other devices or electrical connection methods.

Figure 1:
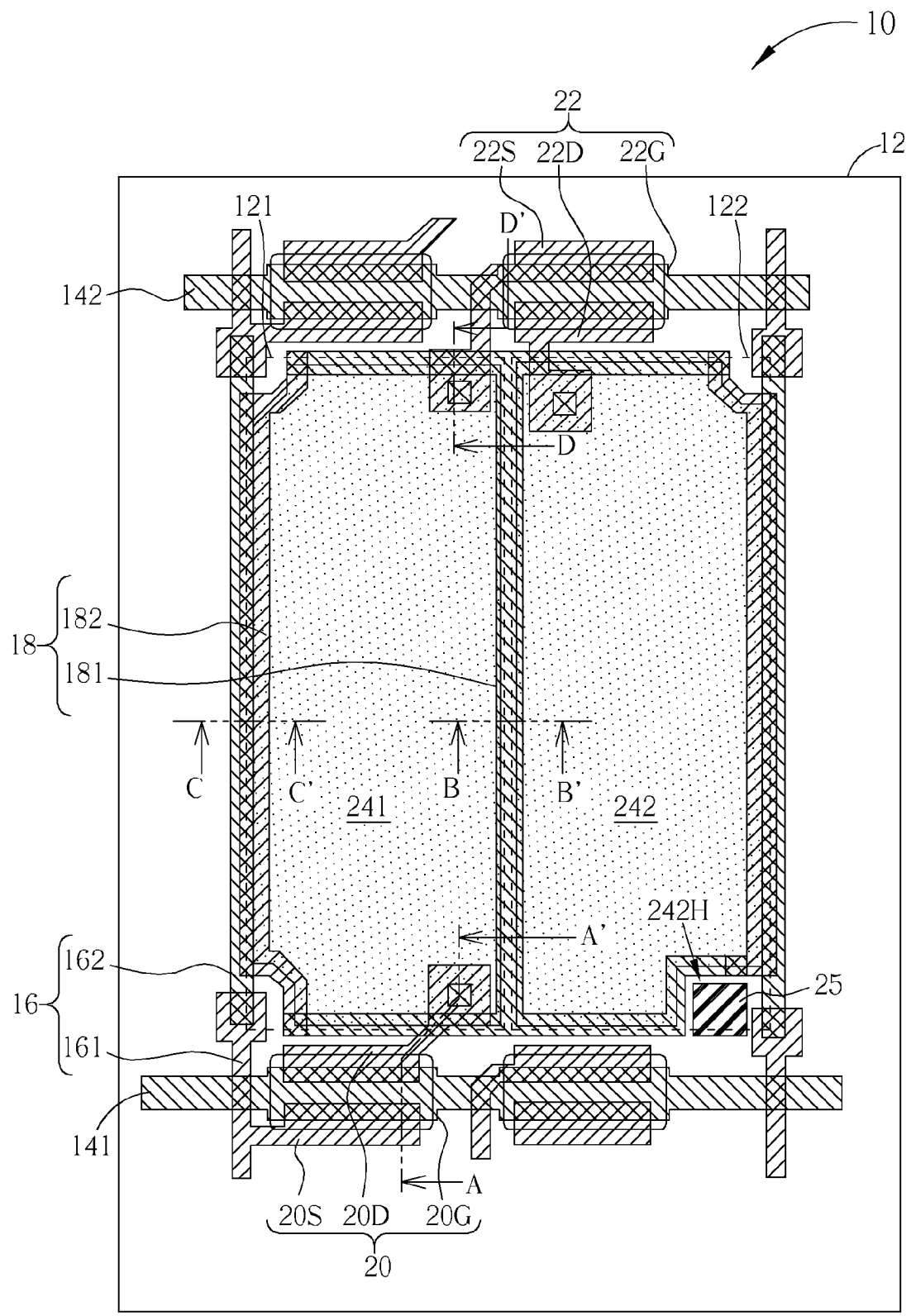
FIG. 1 is a schematic top view illustrating a pixel structure in accordance with a first preferred embodiment of the present invention.
Figure 2:
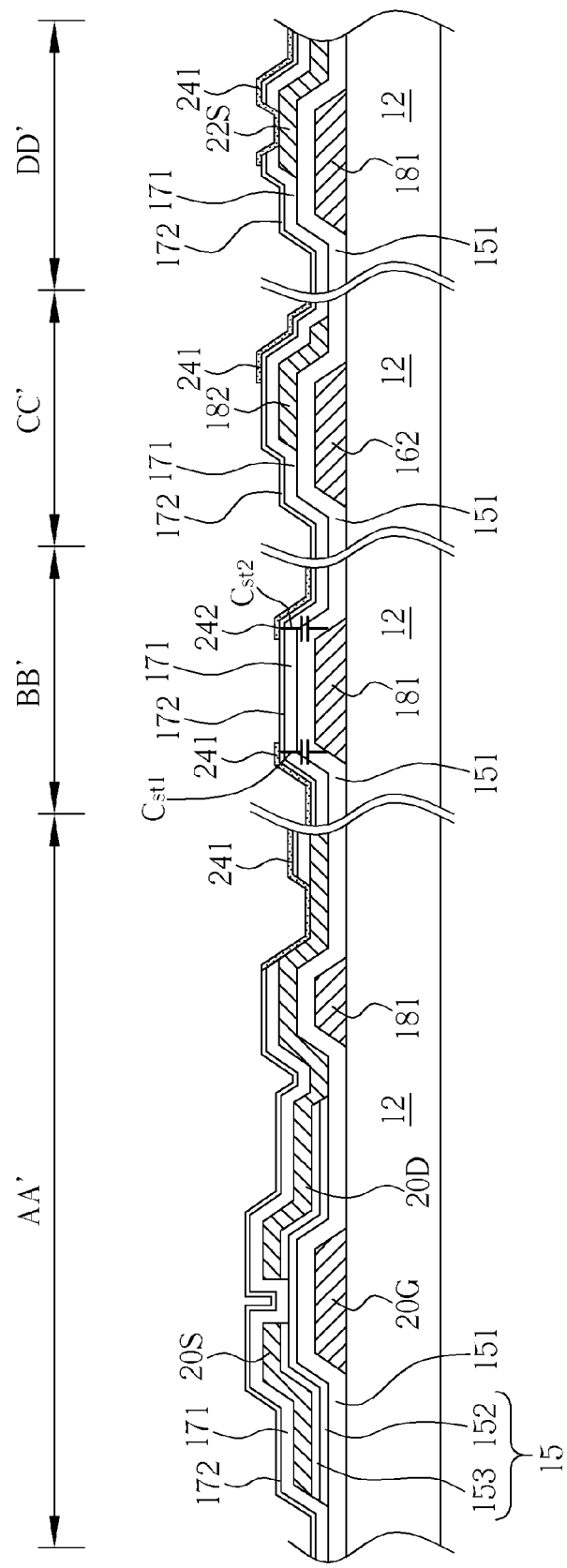
FIG. 2 is a schematic cross-sectional view of the pixel structure of FIG. 1 along lines A-A', B-B', C-C' and D-D'.

Please refer to FIGS. 1-2. FIG. 1 is a schematic top view illustrating a pixel structure in accordance with a first preferred embodiment of the present invention, and FIG. 2 is a schematic cross-sectional view of the pixel structure of FIG. 1 along lines A-A', B-B', C-C' and D-D'. As shown in FIGS. 1-2, the pixel structure 10 mainly includes a substrate 12, a first gate line 141, a second gate line 142, a data line 16, a common line 18, a first switching element 20, a second switching element 22, a first pixel electrode 241, and a second pixel electrode 242. In this embodiment, a single pixel structure 10 includes three sub-pixels e.g. a red sub-pixel, a green sub-pixel and a blue sub-pixel, and at least part or all of the sub-pixels are provided with data signals delivered by the same data line. In this embodiment, two sub-pixels are provided with data signals delivered by the same data line, but the number of sub-pixels which share the same data line is not limited. For instance, three or more sub-pixels may share the same data line. The substrate 12 includes a plurality of sub-pixel regions e.g. a first sub-pixel region 121 and a second sub-pixel region 122. The first gate line 141 is disposed on one side of the first sub-pixel region 121 and the second sub-pixel region 122. The second gate line 142 is disposed on the other side of the first sub-pixel region 121 and the second sub-pixel region 122 opposite to the first gate line 141. The data line 16 is disposed on one side of the first sub-pixel region 121 of the substrate 12, and the common line 18 is disposed on the substrate 12. The first switching element 20 is disposed in the first sub-pixel region 121, and the second switching element 122 is disposed in the second sub-pixel region 122. In this embodiment, the first switching element 20 and the second switching element 22 are implemented in the form of thin film transistor (TFT), but not limited. In addition, the first switching element 20 includes a first gate electrode 20G, a first source electrode 20S and a first drain electrode 20D, wherein the first gate electrode 20G is electrically connected with the first gate line 141, and the first source electrode 20S is electrically connected with the data line 16. The second switching element 22 includes a second gate electrode 22G, a second source electrode 22S and a second drain electrode 22D, wherein the second gate electrode 22G is electrically connected to the second gate line 142. Furthermore, the first pixel electrode 241 is disposed in the first sub-pixel region 121, and electrically connected to the first drain electrode 20D. The first pixel electrode 241 also partially overlaps with the common line 18 to form a first storage capacitor $C_{st1}$. The second pixel electrode 242 is disposed in the second sub-pixel region 122, and electrically connected to the second drain electrode 22D. The second pixel electrode 242 also partially overlaps with the common line 18, forming a second storage capacitor $C_{st2}$. It is noted that the overlapping area between the first pixel electrode 241 and the common line 18 may be identical to or different from that between the second pixel electrode 242 and the common line 18 based on different design considerations. In other words, the first storage capacitor $C_{st1}$ and the second storage capacitor $C_{st2}$ may be identical or not different. Besides, the second source electrode 22S of the second switching element 22 is electrically connected to the first drain electrode 20D through the first pixel electrode 241. Therefore, the first source electrode 20S and the second source electrode 22S are supplied with different data signals which are both delivered by the same data line 16. Consequently, the number of data lines may be reduced to half of the original number of data lines, which can therefore advance the aperture ratio.

The data signal is delivered to the second source electrode 22S through the first pixel electrode 241 made of transparent conductive material, instead of through other non-transparent conductive layer. As a result, the aperture ratio is increased. In addition, in order to be electrically connected to the first pixel electrode 241, the second source electrode 22S is extended to the bottom of the first pixel electrode 241 and in contact with the first pixel electrode 241. The extension part of the second source electrode 22S renders the aperture ratio of the first sub-pixel region 121 slightly smaller than that of the second sub-pixel region 122, but the adverse influence upon the aperture ratio is limited. In case an optimal displaying effect is required, a breach 242H having substantially the same size as the second source electrode 22S may be selectively formed in the second pixel electrode 242 in the second sub-pixel region 122. The breach 242H is able to equalize the aperture ratio in the first sub-pixel region 241 and the second sub-pixel region 242, such that the displaying effect in the first sub-pixel region 241 and the second sub-pixel region 242 may be substantially identical. In addition, a spacer 25 may be disposed on the position corresponding to the breach 242H of the second pixel electrode 242 so that the cell breach between the substrate 12 and the other substrate (not shown) may be maintained.

In this embodiment, the common line 18 includes a first common section 181 and a second common section 182, where the first common section 181 is disposed between the first sub-pixel region 121 and the second sub-pixel region 122, on one side of the first sub-pixel region 121 and the second sub-pixel region 122 facing the first gate line 141, and on one side of the first sub-pixel region 121 and the second sub-pixel region 122 facing the second gate line 142 on the substrate 12. In other words, the first common section 181 has an I-shaped (i.e. H-shape rotated 90 degrees) structure. The second common section 182 is disposed on the other side of the first sub-pixel region 121 opposite to the second sub-pixel region 122, and on the other side of the second sub-pixel region 122 opposite to the first sub-pixel region 121 of the substrate 12. Specifically, the second common section 182 is disposed in the left peripheral region of the first sub-pixel region 121, and in the right peripheral region of the second sub-pixel region 122 (when viewed along the direction of FIG. 1). Furthermore, the second common section 182 and the first common section 181 are made of different conductive layers, but electrically connected to each other. Accordingly, the common line 18 surrounds the fist sub-pixel region 121 and the second sub-pixel region 122 in this embodiment, but not limited. In addition, the data line 16 includes a first data section 161 and a second data section 162, where the first data section 161 is disposed on the opposite side of the first switching element 20 with respect to the second sub-pixel region 122, and the second data section 162 is disposed on the opposite side of the first sub-pixel region 121 with respect to the second sub-pixel region 122. Specifically, the first data section 161 is disposed in the bottom left corner of the first sub-pixel region 121, adjacent to the first switching element 20, and intersected with the first gate line 141; and the second data section 162 is disposed in the left peripheral region of the first sub-pixel region 121 (when viewed along the direction of FIG. 1). The first data section 161 and the second data section 62 are made of different conductive layers, but electrically connected to each other. Also, the second common section 182 partially overlaps with the second data section 162, so that the aperture ratio is increased. In this embodiment, the first gate line 141, the second gate line 142, the first common section 181 and the second data section 162 are made of the first metal layer, while the first data section 161, the second common section 182, the first source electrode 20S, the first drain electrode 20D, the second source electrode 22S and the second drain electrode 22D are made of the second metal layer, but not limited.

The method of forming the pixel structure 10 of this embodiment is illustrated as follows with reference to FIGS. 1-2. First, a substrate 12 is provided, and a first sub-pixel region 121 and a second sub-pixel region 122 are defined on the substrate 12. Then, a first metal layer is formed on the substrate 12, and the first metal layer is patterned by e.g. photolithographic and etching techniques to form a first patterned metal layer. The first patterned metal layer includes a first gate line 141, a second gate line 142, a first gate electrode 20G, a second gate electrode 22G, a second data section 162 and a first common section 181, and the relative locations thereof have been illustrated in the aforementioned description.

Subsequently, a gate insulating layer 151 and a semiconductor layer 15 are formed on the substrate 12 and the first patterned metal layer. The semiconductor layer 15 may include an amorphous silicon layer 152 and a heavily doped amorphous silicon layer 153, but not limited. The semiconductor layer 15 corresponding to the first gate electrode 20G and the second gate electrode 22G forms channel regions, and the gate insulating layer 151 partially exposes the second data section 162. Then, a second metal layer is formed on the semiconductor layer 15, and the second metal layer is patterned by e.g. photolithographic and etching techniques to form a second patterned metal layer. The heavily doped amorphous silicon layer 153 may be patterned as well when patterning the second metal layer. The second patterned metal layer includes a first source electrode 20S, a first drain electrode 20D, a second source electrode 22S, a second drain electrode 22D, a first data section 161 and a second common section 182. The first data section 161 is disposed in the bottom left corner of the first sub-pixel region 121, adjacent to the first switching element 20, and intersected with the first gate line 141, and the first data section 161 is electrically connected to the exposed second data section 162. The relative locations of other elements are illustrated in the aforementioned description.

At least a dielectric layer is then formed on the second patterned metal layer. The dielectric layer may be either a single-layered dielectric layer or a composite dielectric layer. In this embodiment, a composite dielectric layer is used. For example, a first dielectric layer 171 and a second dielectric layer 172 are sequentially formed, and patterned to partially expose the first drain electrode 20D, the second source electrode 22S and the second drain electrode 22D. Subsequently, a transparent conductive layer e.g. an indium tin oxide (ITO) layer is formed on the substrate 12. The transparent conductive layer is then patterned to form a first pixel electrode 241 and a second pixel electrode 242. The first pixel electrode 241 is disposed in the first sub-pixel region 121, and electrically connected to the exposed first drain electrode 20D and the exposed second source electrode 22S. Consequently, the first pixel electrode 241 can be provided with the data signal delivered from the data line 16, and the second source electrode 22S can be electrically connected to the first drain electrode 241 through the first pixel electrode 241. The second pixel electrode 242 is disposed in the second sub-pixel region 122, and electrically connected to the exposed second drain electrode 22D. As described, since the second source electrode 22S is electrically connected to the first pixel electrode 241, the data signal delivered by the data line 16 can be transferred to the second source electrode 22S through the first pixel electrode 241. Also, the data line 16 is disposed in the peripheral region of the first sub-pixel region 121, instead of the region between the first sub-pixel region 121 and the second sub-pixel region 122, and therefore the gap between the first sub-pixel region 121 and the second sub-pixel region 122 can be reduced. As a result, the aperture ratio can be improved.

Figure 3:
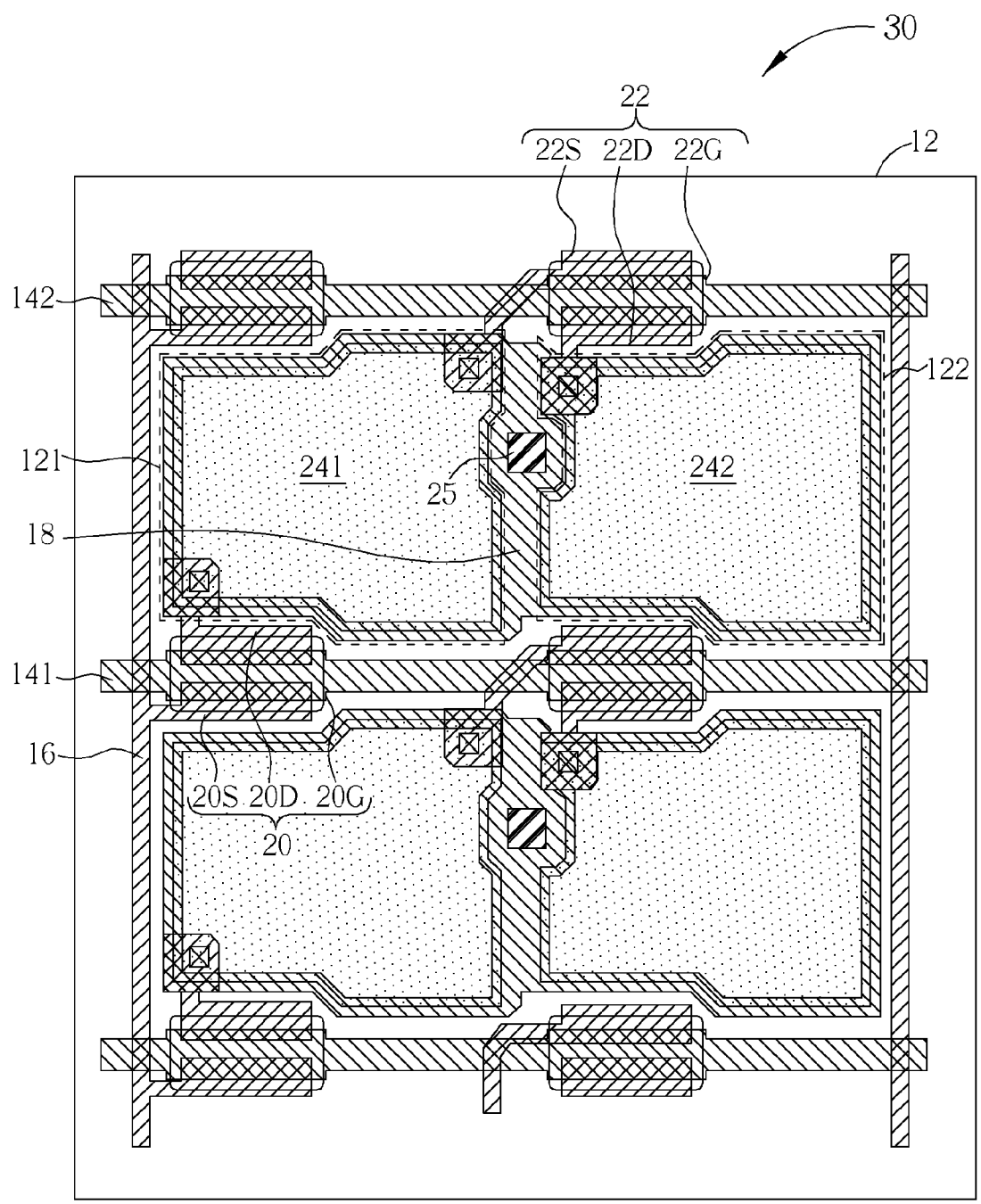
FIG. 3 is a schematic diagram illustrating a pixel structure in accordance with a second preferred embodiment of the present invention.

To simplify the description and for the convenience of comparison between each of the embodiments of the present invention, identical elements are denoted by identical numerals. Also, only the differences are illustrated, and repeated descriptions are not redundantly given. Please refer to FIG. 3. FIG. 3 is a schematic diagram illustrating a pixel structure in accordance with a second preferred embodiment of the present invention. As shown in FIG. 3, a single pixel of the pixel structure 30 in this embodiment includes four sub-pixels, which are a red sub-pixel, a green sub-pixel, a blue sub-pixel and a white sub-pixel respectively. Namely, the number of sub-pixels in this embodiment is different from that in the first embodiment. In this embodiment, the common line 18 is made of the same metal layer e.g. a first metal layer, and the data line 16 is made of the same metal layer e.g. a second metal layer. In addition, a spacer 25 is disposed over the common line 18 positioned between the first sub-pixel region 121 and the second sub-pixel region 122. Similar to the first embodiment, the second source electrode 22S of the second switching element 22 of the pixel structure 30 in this embodiment is electrically connected to the first drain electrode 20D through the first pixel electrode 241, such that the first switching element 20 and the second switching element 22 can be provided with the data signals delivered by the same data line 16.

Figure 4:
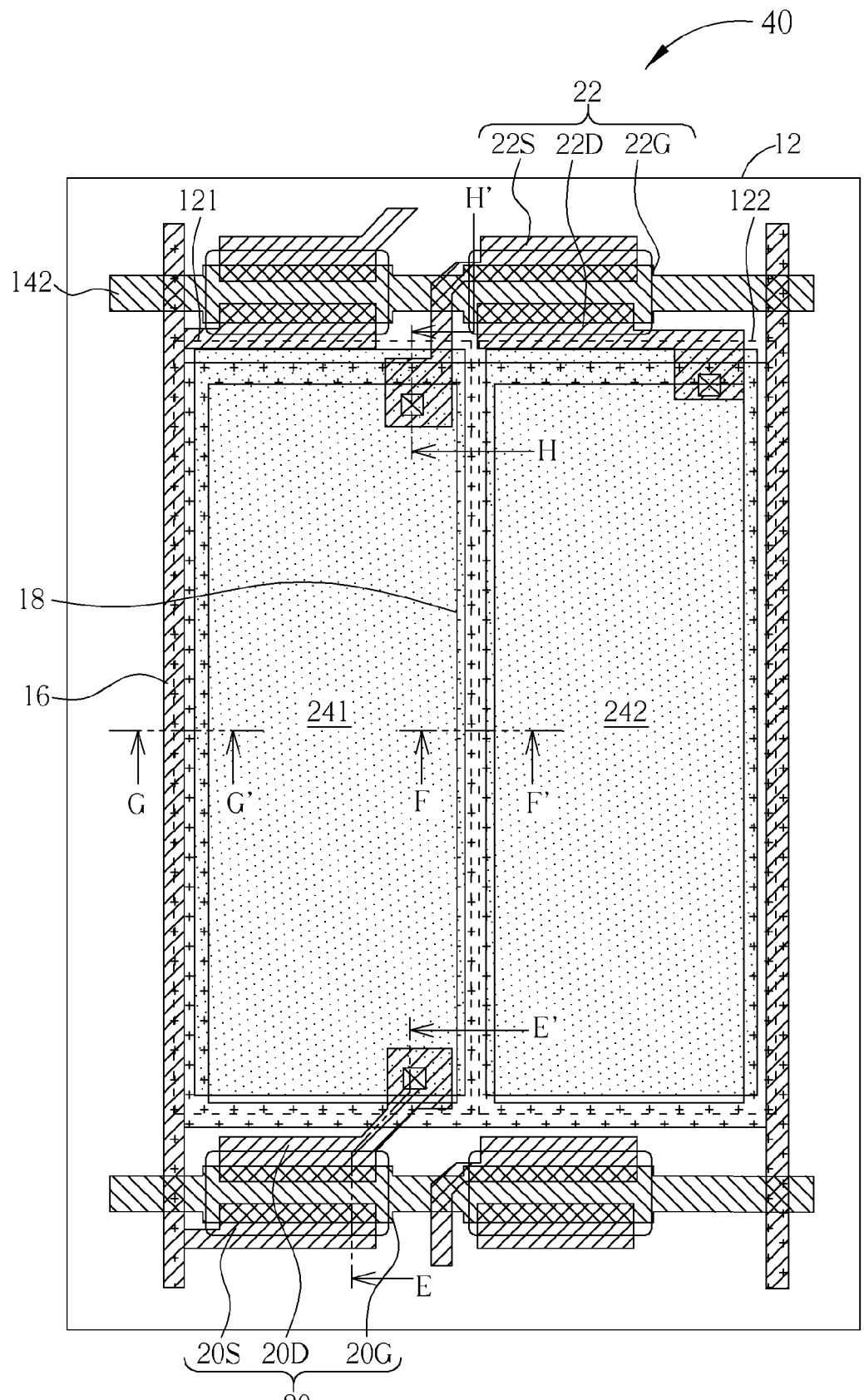
FIG. 4 is a schematic diagram illustrating a pixel structure in accordance with a third preferred embodiment of the present invention.
Figure 5:
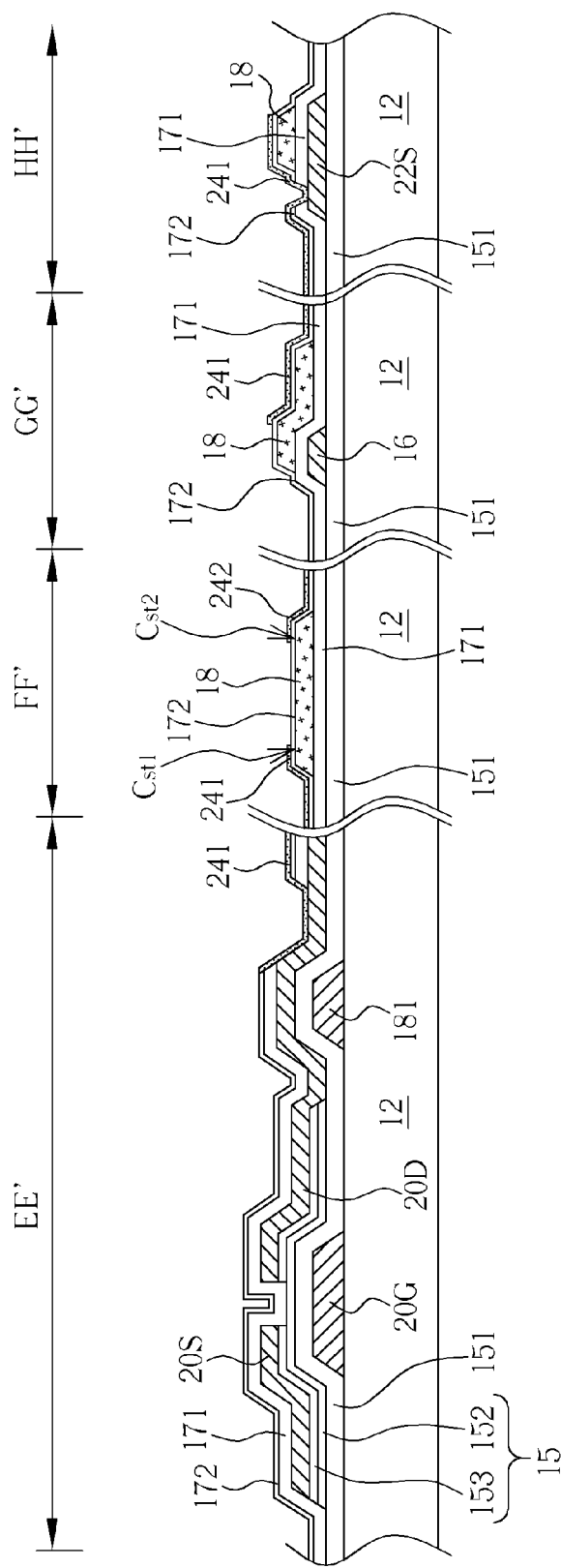
FIG. 5 is a cross-sectional view of the pixel structure of FIG. 4 along lines E-E', F-F', G-G' and H-H'.

Please refer to FIGS. 4-5. FIG. 4 is a schematic diagram illustrating a pixel structure in accordance with a third preferred embodiment of the present invention, and FIG. 5 is a cross-sectional view of the pixel structure of FIG. 4 along lines E-E', F-F', G-G' and H-H'. As shown in FIGS. 4-5, the common line 18 of the pixel structure 40 in this embodiment is made of a metal layer different from that of the data line 16 or that of the first gate line 141/the second gate line 142. For instance, the common line 18 is made of a third metal layer, while the data line 16 is made of a second metal layer, and the first gate line 141/the second gate line 142 are made of a first metal layer. Since the third metal layer is disposed over the first metal layer, the third metal layer, compared to the first metal layer, is closer to the first pixel electrode 241/the second pixel electrode 242. Consequently, with the same overlapping area, the first storage capacitor $C_{st1}$ formed by the common line 18 and the first pixel electrode 241, and the second storage capacitor $C_{st2}$ formed by the common line 18 and the second pixel electrode 242 are increased. In addition, the common line 18 of this embodiment surrounds the first sub-pixel region 121 and the second sub-pixel region 122. The data line 16 is disposed on the other side of the first sub-pixel region 121 opposite to the second sub-pixel region 122, i.e. the data line 16 is disposed in the left periphery region of the first sub-pixel region 121 (when viewed along the direction of FIG. 4), and partially overlaps with the common line 18. The shape of the common line 18, nevertheless, is not limited, and can be altered based on desired storage capacitance.

The method of forming the pixel structure 40 of this embodiment is illustrated as follows with reference to FIGS. 4-5. First, a substrate 12 is provided, and a first sub-pixel region 121 and a second sub-pixel region 122 are defined on the substrate 12. Subsequently, a first metal layer is formed on the substrate 12, and the first metal layer is patterned by photolithographic and etching techniques to form a first patterned metal layer. The first patterned metal layer includes a first gate line 141, a second gate line 142, a first gate electrode 20G and a second gate electrode 22G.

Thereafter, a gate insulating layer 151 and a semiconductor layer 15 are formed on the substrate 12 and the first patterned metal layer. The semiconductor layer 15 may include an amorphous silicon layer 152 and a heavily doped amorphous silicon layer 153, but not limited. The semiconductor layer 15 corresponding to the first gate electrode 20G and the second gate electrode 22G forms channels. Subsequently, a second metal layer is formed on the semiconductor layer 15, and the second metal layer is patterned by photolithographic and etching techniques to form a second patterned metal layer. The heavily doped amorphous silicon layer 153 may be patterned along with the second metal layer. The second patterned metal layer includes a first source electrode 20S, a first drain electrode 20D, a second source electrode 22S, a second drain electrode 22D and a data line 16.

Following that, a first dielectric layer 171 is formed on the second patterned metal layer. Then, a third metal layer is formed on the first dielectric layer 171, and the third metal layer is patterned by photolithographic and etching techniques to form a common line 18. Subsequently, a second dielectric layer 172 is formed on the first dielectric layer 171 and the third metal layer, and the first dielectric layer 171 and the second dielectric layer 172 are patterned to partially expose the first drain electrode 20D, the second source electrode 22S and the second drain electrode 22D. A transparent conductive layer e.g. an ITO layer is then formed on the substrate 12, and the transparent conductive layer is patterned to form a first pixel electrode 241 and a second pixel electrode 242. The first pixel electrode 241 is disposed in the first sub-pixel region 121, and electrically connected to the exposed first drain electrode 20D and the exposed second source electrode 22S. Accordingly, the first pixel electrode 241 can be electrically connected to the first drain electrode 20D and provided with the data signal delivered by the data line 16, while the second source electrode 22S can be electrically connected to the first drain electrode 20D through the first pixel electrode 241. The second pixel electrode 242 is disposed in the second sub-pixel region 122, and electrically connected to the exposed second drain electrode 22D. As described, due to the electrical connection between the second source electrode 22S and the first pixel electrode 241, the second source electrode 22S can receive the data signal delivered by the data line 16 through the first pixel electrode 241.

Figure 6:
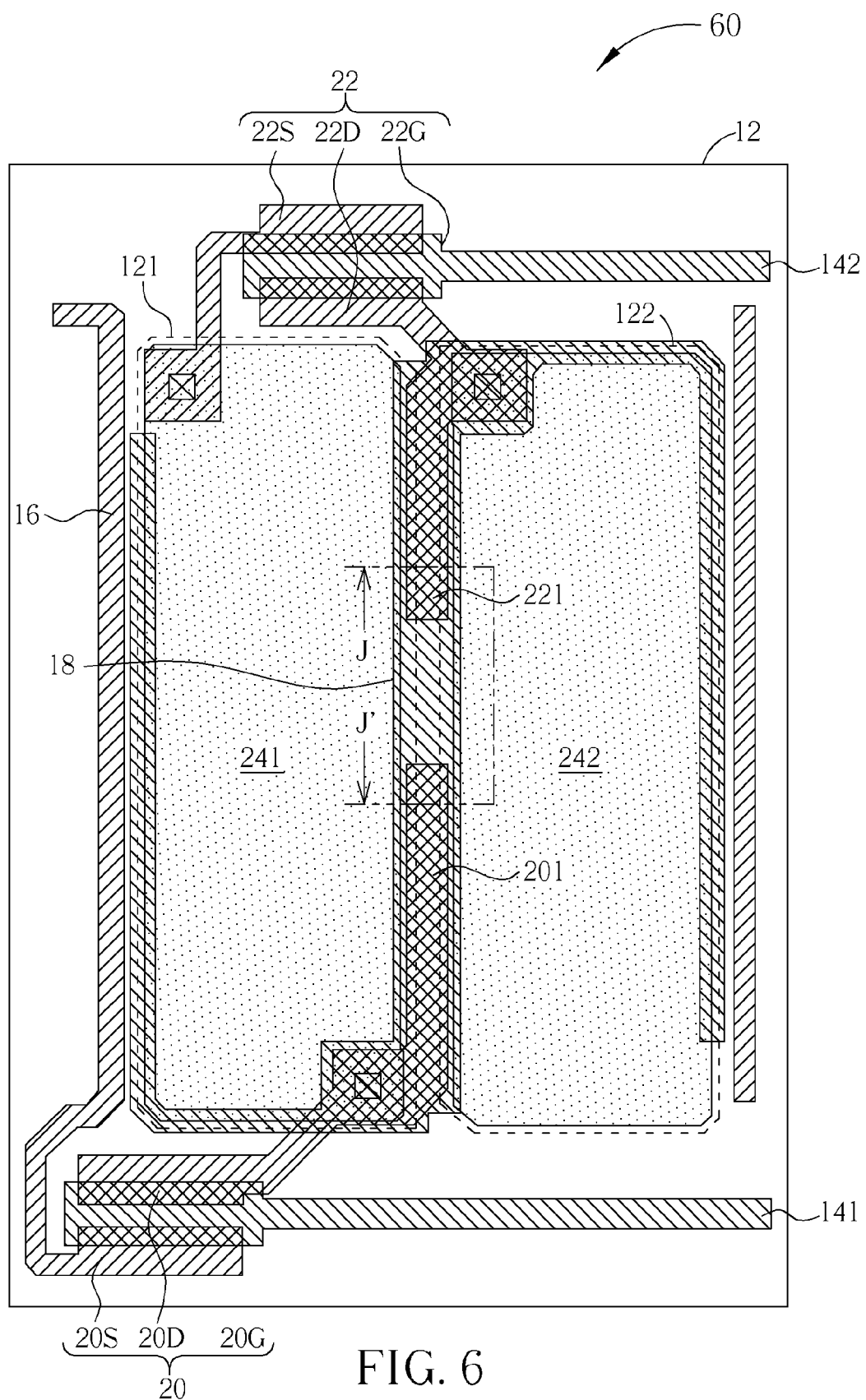
FIG. 6 is a schematic diagram illustrating a pixel structure in accordance with a fourth preferred embodiment of the present invention.
Figure 7:
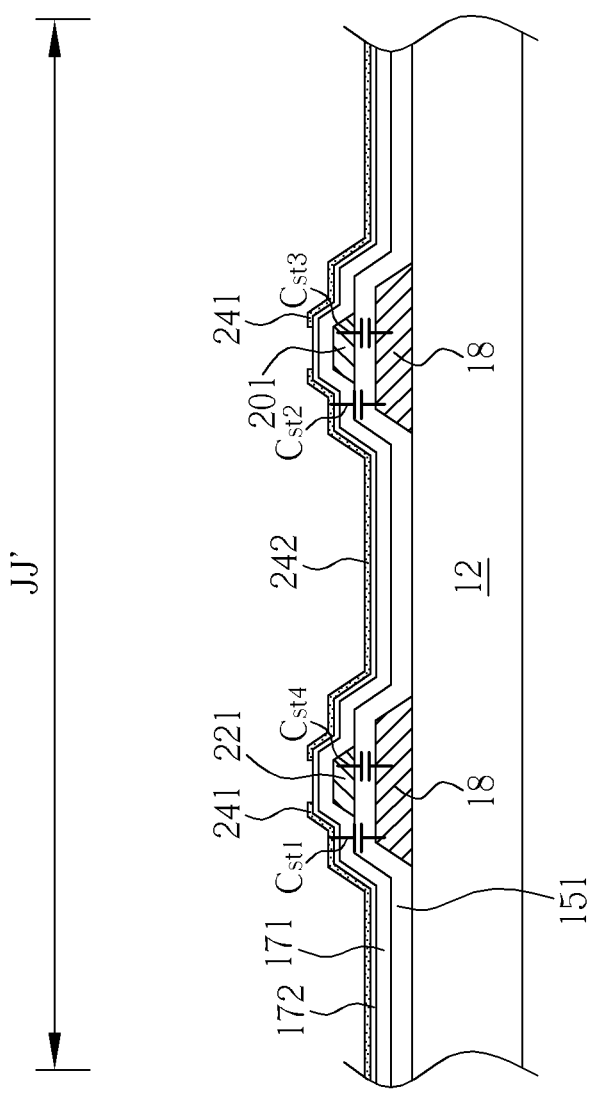
FIG. 7 is a cross-sectional view of the pixel structure of FIG. 6 along a line J-J'.

Please refer to FIGS. 6-7. FIG. 6 is a schematic diagram illustrating a pixel structure in accordance with a fourth preferred embodiment of the present invention, and FIG. 7 is a cross-sectional view of the pixel structure of FIG. 6 along a line J-J'. As shown in FIGS. 6-7, the first pixel electrode 241 and the common line 18 partially overlap, forming a first storage capacitor $C_{st1}$, and the second pixel electrode 242 and the common line 18 partially overlap, forming a second storage capacitor $C_{st2}$. Different from the first preferred embodiment, the pixel structure 60 in this embodiment further includes a first extension part 201 and a second extension part 221. The first extension part 201 electrically connects to the first drain electrode 20D, and partially overlaps with the common line 18, thereby forming a third storage capacitor $C_{st3}$. The second extension part 221 electrically connects to the second drain electrode 22D, and partially overlaps with the common line 18, thereby forming a fourth storage capacitor $C_{st4}$. Based on different required storage capacitances, the areas of the first extension part 201 and the second extension part 221 may be altered to be identical or different, such that the storage capacitances of the third storage capacitor $C_{st3}$ and the fourth storage capacitor $C_{st4}$ can be modified as required. In this embodiment, the first gate line 141, the second gate line 142 and the common line 18 are made of the first metal layer, and the data line 16, the first extension part 201 and the second extension part 221 are made of the second metal layer, but not limited.

In conclusion, the pixel electrode made of transparent conductive material in the pixel structure of the present invention is used as an interface for electrically connecting the data line and the source electrode of the switching element of adjacent sub-pixel region. Consequently, the number of data lines can be reduced, and the aperture ratio of the pixel structure is accordingly advanced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A method of forming a pixel structure, comprising:
providing a substrate, and defining a first sub-pixel region and a second sub-pixel region on the substrate;
forming a first patterned metal layer on the substrate, the first patterned metal layer comprising:
a first gate line disposed on a side of the first sub-pixel region and the second sub-pixel region;
a second gate line disposed on the other side of the first sub-pixel region and the second sub-pixel region opposite to the first gate line;
a first gate electrode disposed in the first sub-pixel region and electrically connected to the first gate line; and
a second gate electrode disposed in the second sub-pixel region and electrically connected to the second gate line;
forming an gate insulating layer and a semiconductor layer;

forming a second patterned metal layer comprising:
- a first source electrode and a first drain electrode disposed in the first sub-pixel region, wherein the first source electrode, the first drain electrode and the first gate electrode form a first switching element; and
- a second source electrode and a second drain electrode disposed in the second sub-pixel region, wherein the second source electrode, the second drain electrode and the second gate electrode form a second switching element;

forming a dielectric layer; and forming a transparent conductive layer on the dielectric layer, and patterning the transparent conductive layer to from:
- a first pixel electrode disposed in the first sub-pixel region and electrically connected to the first drain electrode, wherein the second source electrode is electrically connected to the first drain electrode through the first pixel electrode; and
- a second pixel electrode disposed in the second sub-pixel region and electrically connected to the second drain electrode.

2. The method of claim 1, wherein the step of forming the second patterned metal layer further comprises forming a data line electrically connected to the first source electrode in a peripheral region of the first sub-pixel region.

3. The method of claim 2, wherein the step of forming the second patterned metal layer further comprises forming a first extension part and a second extension part, the first extension part being electrically connected to the first drain electrode and partially overlapping with the common line to form a third storage capacitor, the second extension part being electrically connected to the second drain electrode, partially overlapping with the common line to form a fourth storage capacitor.

4. The method of claim 1, further comprising forming a common line, wherein the common line and the first pixel electrode partially overlap to form a first storage capacitor, and the common line and the second pixel electrode partially overlap to form a second storage capacitor.

5. The method of claim 4, wherein the common line is made of a third metal layer.

6. The method of claim 1, wherein the step of forming the first patterned metal layer further comprises forming a second data section disposed between the first gate line and the second gate line, and wherein the step of forming the second patterned metal layer further comprises forming a first data section intersected with the first gate line, and the first data section, the second data section and the first source electrode are electrically connected.

7. The method of claim 6, wherein the step of forming the first patterned metal layer further comprises forming a first common section disposed between the first sub-pixel region and the second sub-pixel region, and wherein the step of forming the second patterned metal layer further comprises forming a second common section disposed in a peripheral region of the first sub-pixel region and the second sub-pixel region, the second common section is electrically connected to the first common section, and the second common section partially overlaps with the second data section.

* * * * *